United States Patent [19]
Montagu

[11] Patent Number: 5,169,050
[45] Date of Patent: Dec. 8, 1992

[54] WIRE BONDER WITH IMPROVED ACTUATOR

[75] Inventor: Jean I. Montagu, Brookline, Mass.

[73] Assignee: General Scanning, Inc., Watertown, Mass.

[21] Appl. No.: 709,618

[22] Filed: Jun. 3, 1991

[51] Int. Cl.⁵ .......................... B23K 37/00; H01F 7/08
[52] U.S. Cl. ...................... 228/4.5; 228/45; 335/179
[58] Field of Search .......... 228/4.5, 1.1, 45; 335/251, 179

[56] References Cited

U.S. PATENT DOCUMENTS

| | | | |
|---|---|---|---|
| 1,077,319 | 11/1913 | Tatum | 335/251 |
| 2,108,775 | 2/1938 | MacGeorge | 335/251 |
| 3,169,215 | 2/1965 | Bliss | 335/251 |
| 3,177,385 | 4/1965 | Montagu | 310/36 |
| 3,624,574 | 11/1971 | Montagu | 335/230 |
| 3,639,871 | 2/1972 | Trbovich et al. | 335/274 |
| 3,921,045 | 11/1975 | Reich et al. | 318/127 |
| 3,999,833 | 12/1976 | Reich et al. | 350/6 |
| 4,443,775 | 4/1984 | Fujitani et al. | 335/251 |
| 4,533,890 | 8/1985 | Patel | 335/229 |
| 4,653,681 | 3/1987 | Dreibelbis et al. | 228/4.5 |
| 4,814,732 | 3/1989 | Pratt | 335/230 |
| 5,078,312 | 1/1992 | Ohashi et al. | 228/1.1 |

FOREIGN PATENT DOCUMENTS 62-21234 1/1987 Japan ..................... 228/4.5
62-247538 10/1987 Japan ..................... 228/4.5

Primary Examiner—Richard K. Seidel
Assistant Examiner—Jeffrey T. Knapp
Attorney, Agent, or Firm—Cesari and McKenna

[57] ABSTRACT

To provide the necessary vertical motion of a wire-bonding head (20) mounted on a flexural pivot (16), a wire-bonding machine (10) includes an actuator comprising a permanent magnet (56) mounted on the flexural pivot (16) and extending into the central passage (49) of a ferromagnetic sleeve (46) in which two oppositely wound coils (50 and 52) are mounted. The magnetic force resulting from current flow through the coils (50 and 52) causes the head assembly (18) to pivot about the flexural-pivot axis (16) and thus cause the magnet (56) to move out of symmetry with respect to the ferromagnetic sleeve (46). The resultant attraction between the permanent magnet (56) and the ferromagnetic sleeve (46) tends to counteract the resistance of the flexural pivot (16) to pivotal displacement from a rest position but does not additionally reduce the stiffness of the flexural pivot to other, undesired modes of motion.

5 Claims, 2 Drawing Sheets

WIRE BONDER WITH IMPROVED ACTUATOR

The present invention concerns wire-bonding machines and relates particularly to actuators used to raise and lower bond heads.

In one type of wire-bonding machine, the bonding head is mounted on a movable carriage such as that of an X-Y table to position the head properly over the workpiece. An actuator on the carriage pivots an arm on which the head is mounted so as to move the head toward and away from the workpiece, i.e., in the Z direction.

The power drawn by the actuator for a given speed and range of motion depends not only on the moment of inertia of the parts to be pivoted but also on the resistance offered by the pivot mount. For this reason, one might propose to use, say, ball bearings for the pivot mount. But their use is not typical in these applications, because they present a number of practical problems, including a comparatively high cost and a susceptibility to fretting corrosion when they are subjected to the limited-range motion of a bonding-head actuator.

The pivot mount of choice therefore is usually a flexural pivot, i.e., a member that bends to permit the desired pivoting. Unfortunately, flexural pivots exert spring forces that add to actuator-current requirements Given that a flexural pivot is to be employed, it might seem logical to keep the stiffness of the flexural pivot low. But lowering the stiffness of the flexural pivot beyond a certain point could cause natural-frequency excitation and undesired modes of motion, such as buckling or bending, that fall within the bandwidth of the X-Y-table motion. In other words, a too-compliant flexural pivot can permit the table motion to cause vibration that the actuator cannot control. Flexural pivots used for such machines must therefore be relatively stiff if the machine is to operate rapidly, and actuators have consequently had to draw significant currents in prior-art machines.

SUMMARY OF THE INVENTION

I have reduced the actuator-current requirements by employing an actuator that uses a "negative spring force" from a permanent magnet to reduce the flexural pivot's effective stiffness to the desired pivoting without reducing its stiffness to other flexure modes. One of the two actuator parts that translate with respect to one another is a ferromagnetic sleeve inside which a current-carrying coil is mounted. The other part is the permanent magnet, whose field links the coil current in such a manner as to tend to cause relative axial motion between the sleeve and the magnet.

One of the actuator parts—preferably the sleeve and coil—is mounted on a movable carriage while the other is mounted on a head assembly mounted on the carriage by means of a flexural pivot so that it pivots in response to actuator force. Because of the pivot mounting, relative motion between the actuator parts is accompanied by an angular-orientation change in which increased departure from a neutral position increases the magnet's proximity to the sleeve.

Superimposed on the current-induced magnetic force, therefore, is a magnetic force that increases with and favors departure from the neutral position, i.e., that has what might loosely be called a "negative spring constant," although the "constant" actually changes considerably. If the neutral position corresponds to that of the flexural pivot's force, the negative spring constant reduces the pivot's effective pivotal stiffness and thus the current needed to achieve a given deflection. Yet the stiffness to other modes of motion does not decrease significantly, so problems do not arise with other vibrational modes whose natural frequencies would not otherwise fall within the control-system bandwidth.

Instead of a single coil, the actuator preferably employs two coils oppositely wound at the permanent magnet's opposite poles. Such an arrangement contributes to minimization of the coil-accommodating gap between the magnet and the sleeve and is thus beneficial even in actuators in which no pivotal motion occurs.

BRIEF DESCRIPTION OF THE DRAWINGS

These and further features and advantages of the present invention are described below in connection with the accompanying drawings, in which.

DETAILED DESCRIPTION OF ILLUSTRATIVE EMBODIMENTS

Figure 1:
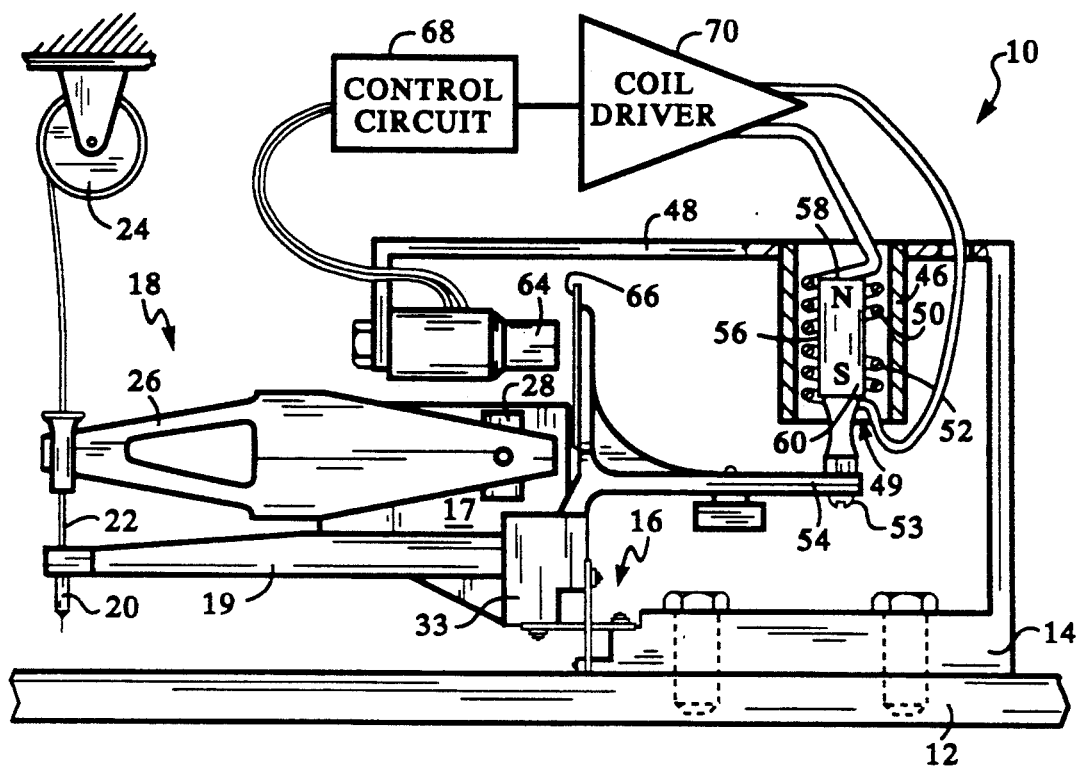
FIG. 1 is a side elevation, with parts broken away, of a wire-bonding mechanism that employs the teachings of the present invention.

FIG. 1 depicts a wire bonder 10 that includes an X-Y table evidenced by a carriage 12 that lies in a motion plane through which means not shown in the drawings translate the carriage in X and Y directions. In other versions, the carriage may be movable in only one direction, although the workpiece in some such versions may be moved in an orthogonal direction. A main frame 14 is mounted on the carriage 12, as is a flexural pivot 16 that pivotably mounts a head-assembly plate 17 on which are mounted various elements of a head assembly 18.

A head-support beam 19 extends outward from the pivot 16 and supports a wire-bonding head 20 that bonds wire 22 from a spool 24 to a workpiece (not shown). The head assembly 18 also includes a clamp 26 mounted on plate 17 and operated by a clamp actuator 28, which pivots the clamp's arms about a vertical axis so that it alternately grasps and releases the wire 22. When the clamp 26 grasps the wire 22 as the head assembly 18 pivots downward, the wire 22 is paid out from the spool 24.

Figure 2:
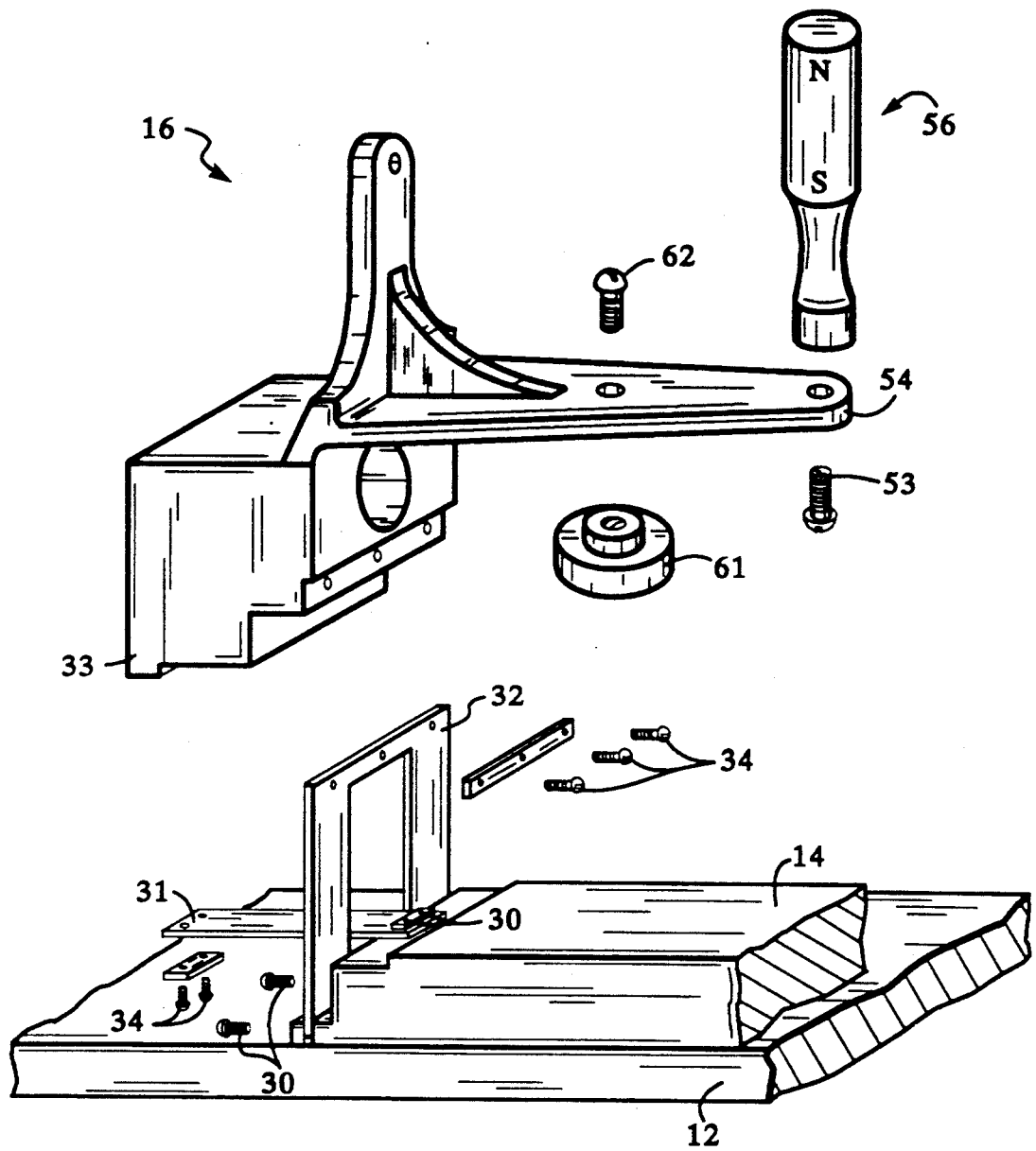
FIG. 2 is an exploded view of the flexural pivot employed in the apparatus of FIG. 1.

FIG. 2 depicts the mounting of the flexural pivot 16 to the carriage 12. Bolts 30 secure horizontal and vertical flexure blades 31 and 32 to the frame 14. The pivot element 33 on which the head-assembly plate 17 is mounted is in turn secured to the other ends of the blades 31 and 32 by further bolts 34. The blades 31 and 32 are resilient and permit pivoting about a pivot axis but are relatively stiff to motion in other modes. They are designed to be relatively compliant to the desired pivotal motion, but the need for stiffness to other modes of motion places limits on that compliance.

Although the illustrated embodiment employs a cross-flexure pivot—i.e., two transversely oriented blades 31 and 32 flex when the pivot number 33 pivots—the particular type of resilient pivot is not critical to the invention, and alternate embodiments can employ single-flexure pivots, for instance.

To cause pivoting about the pivot axis and thus raise and lower the head 20, the wire bonder 10 employs an actuator that includes a generally cylindrical iron sleeve 46 (FIG. 1) mounted in an upper wall 48 of the main frame 14. In the central passage 49 of the sleeve 46 are mounted two oppositely wound coils 50 and 52. By means of a bolt 53, an actuator arm 54 extending from the pivot element 33 mounts a permanent magnet 56 so disposed that its poles are axially displaced; the north pole 58 is located inside coil 50, and the south pole 60 is located inside coil 52. A counterweight 61 secured to the actuator arm 54 by a bolt 62 may be used for balance.

Figure 3:
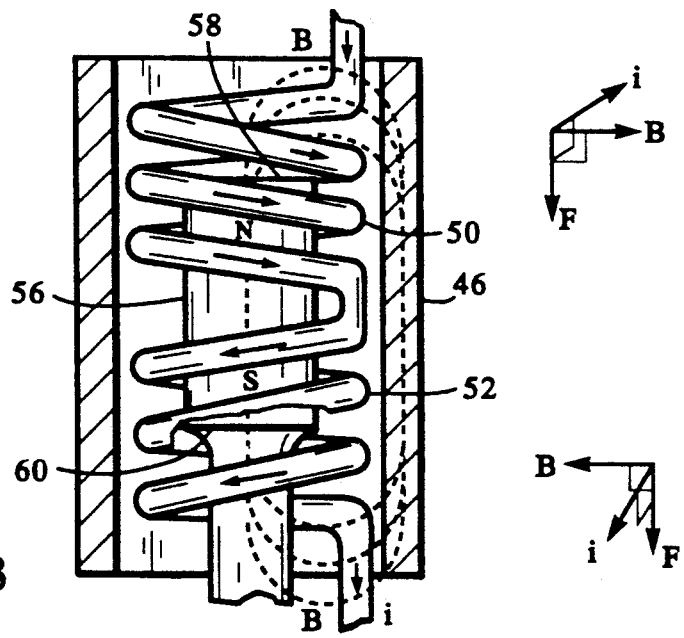
FIG. 3 is a cross-sectional view of the sleeve revealing the coil and magnet employed in the actuator of the present invention.

As FIG. 3 shows in more detail, current flowing downward in the neighborhoods of the poles 58 and 60 interacts with the poles' opposite magnetic fields to yield a force o the coil that, because the two coils are wound oppositely, is downward in both coils. When current flows downward, therefore, the magnet 56 experiences an upward force, while an upward current causes it to experience a downward force.

To control the position of the head 20, a position sensor 64 (FIG. 1) mounted on the main frame 14 senses the position of a target 66 mounted on the head-assembly arm 17 and applies a position-indicating signal to a control circuit 68. The control circuit causes a coil driver 70 to drive the coils 50 and 52 with the currents required to achieve the proper head position. The drawing depicts the coils as being provided by a common conductor driven by a single amplifier, but separate conductors could be used instead, in which case the current driver might be embodied in a pair of amplifiers.

FIG. 1 depicts the head assembly 18 so oriented that the flexural pivot is in the rest position, in which it applies no torque to the assembly. The actuator is so arranged that the poles 58 and 60 are both substantially equidistant from opposite sides of the sleeve walls when the head assembly 18 is in this position. The forces that the permanent magnet exerts on opposite wall sides therefore cancel.

When the coil driver 70 drives current through the coils 50 and 52, the resultant motion of the head assembly pivots the magnet 56 so that this symmetry no longer prevails; one of the poles 58 and 60 is closer to one side of the ferromagnetic sleeve 46, and the other pole is closer to the other. The resultant force urges the actuator toward further departure from the rest position and therefore acts in contrast to the restorative force that the flexural pivot 16 exerts. The effective pivotal stiffness of the system is therefore less than it would be with a conventional actuator, yet the (desirable) stiffness to other modes of motion is not significantly reduced.

The illustrated embodiment has another advantage over certain types of actuators in that its coils 50 and 52 are stationary, so the leads that connect them to the typically stationary drive circuitry are not required to undergo the repetitive, fatigue-inducing flexure required of similar leads in other actuators. Still, the broader teachings of the present invention can be embodied in an actuator in which it is the magnet that is stationary while the sleeve and coil are mounted on the moving member; the same "negative spring constant" would result.

It should also be noted that the negative-spring-constant effect does not depend on the use of opposed coils; a single coil appropriately linked by the magnet's flux can achieve the same motion. But opposed coils do not require as great a coil-accommodating gap between the magnet and the sleeve, and a smaller gap results not only in greater negative-spring force but also in greater axial force. I therefore prefer the opposed-coil arrangement not only for linear actuators used in pivoting arrangement but also for linear actuators generally.

Although the above discussion concentrates on head pivoting, the same approach can also be employed in the clamp actuator 28. Clearly, the clamp motion is also pivotal, and the moving clamp parts are also subjected to the X-Y-table motion that would cause unacceptably-high vibration in modes other than the desired pivotal mode if the stiffness to those modes of motion were not high enough.

It is therefore apparent that the present invention can be practiced in a wide variety of embodiments and constitutes a significant advance in the art.

I claim:

1. A wire-bonding apparatus comprising:
   A) a carriage and means for translating the carriage within a motion plane;
   B) a head assembly including a wire-bonding head;
   C) a flexural pivot mounting the head assembly on the carriage for pivotal motion that causes the head to move transversely of the motion plane; and,
   D) for pivoting the head assembly, an actuator comprising:
      i) a ferromagnetic sleeve mounted on one of the assembly and the carriage and defining a central passage and an axis extending therethrough;
      ii) a permanent magnet mounted on the other of the assembly and the carriage, with its north and south poles axially displaced in the passage, for relative axial motion with respect to the sleeve;
      iii) a coil mounted in the passage and coiled around the permanent magnet in a fixed position with respect to the sleeve; and
      iv) a coil driver for so driving the coil as to cause it to induce a magnetic field that causes axial force on the permanent magnet;

whereby the coil driver tends to pivot the head assembly and thereby vary the proximity of the permanent magnet to the sleeve so as to reduce the effective stiffness of the head mounting to the pivoted motion without affecting its stiffness to other motion modes.

2. A wire-bonding apparatus as defined in claim 1 wherein:
   A) the coil is coiled around the magnet's north pole;
   B) the actuator includes a second coil coiled around the magnet's south pole; and
   C) the coil driver so drives both coils as to cause them to induce at their respective poles oppositely directed magnetic fields that cause axial force on the permanent magnet in the same direction.

3. A wire-bonding apparatus as defined in claim 2 wherein:
   A) a single conductor includes a first coiled portion, which forms the fist-mentioned coil, and a second coiled portion, coiled oppositely to the first coiled portion, which forms the second coil; and
   B) the coil driver drives a common current through both coils.

4. A linear actuator comprising:
   A) a ferromagnetic sleeve defining a central passage and an axis extending therethrough;
   B) a permanent magnet mounted with its north and south poles axially displaced in the passage for relative axial motion with respect to the sleeve;

C) first and second coils mounted in the passage and coiled around the north and south poles, respectively, in fixed positions with respect to the sleeve; and D) a coil driver for so driving the first and second coils as to cause them to induce at their respective poles oppositely directed magnetic fields that cause axial forces on the magnet in a common direction.

5. A linear actuator as defined in claim 4 wherein:

A) a single conductor includes a first coiled portion, which forms the first-mentioned coil, and a second coiled portion, coiled oppositely to the first coiled portion, which forms the second coil; and B) the coil driver drives a common current through both coils.

* * * * *

UNITED STATES PATENT AND TRADEMARK OFFICE
CERTIFICATE OF CORRECTION

PATENT NO. : 5,169,050

DATED : December 8, 1992

INVENTOR(S) : Jean I. Montagu

It is certified that error appears in the above-identified patent and that said Letters Patent is hereby corrected as shown below:

In column 1, at the end of line 27, —.— should be inserted after "requirements".

In column 3, line 17, after "force", the "o" should read —on—.

In column 4, line 58, "fist-mentioned" should read —first-mentioned—.

Signed and Sealed this

Twenty-third Day of November, 1993

Attest:

BRUCE LEHMAN

Attesting Officer

Commissioner of Patents and Trademarks